(12) United States Patent
Yasukawa et al.

(10) Patent No.: US 10,425,990 B2
(45) Date of Patent: Sep. 24, 2019

(54) VACUUM PROCESSING DEVICE

(71) Applicant: CANON ANELVA CORPORATION, Kawasaki-shi, Kanagawa-ken (JP)

(72) Inventors: Hidehiro Yasukawa, Kawasaki (JP); Masahiro Sugihara, Yokohama (JP)

(73) Assignee: CANON ANELVA CORPORATION, Kawasaki-Shi, Kanagawa-Ken (JP)

( * ) Notice: Subject to any disclaimer, the term of this patent is extended or adjusted under 35 U.S.C. 154(b) by 995 days.

(21) Appl. No.: 14/931,655

(22) Filed: Nov. 3, 2015

(65) Prior Publication Data
US 2016/0057812 A1 Feb. 25, 2016

Related U.S. Application Data

(63) Continuation-in-part of application No. PCT/JP2014/001181, filed on Mar. 4, 2014.

(30) Foreign Application Priority Data

Jun. 11, 2013 (JP) .................. 2013-122527

(51) Int. Cl.
*H01L 21/67* (2006.01)
*H05B 3/00* (2006.01)
(Continued)

(52) U.S. Cl.
CPC ......... *H05B 3/0047* (2013.01); *C23C 14/541* (2013.01); *F27D 7/06* (2013.01);
(Continued)

(58) Field of Classification Search
CPC ......... H05B 3/0047; H05B 3/143; F27D 7/06; F27D 15/02; F27D 2007/066;
(Continued)

(56) References Cited

U.S. PATENT DOCUMENTS

| 6,514,347 B2 * | 2/2003 | Denpoh | .............. C23C 16/4585 118/500 |
| 2003/0190823 A1 * | 10/2003 | Keeton | ............. H01L 21/67109 438/795 |
| 2011/0253037 A1 | 10/2011 | Tsunekawa et al. | |

FOREIGN PATENT DOCUMENTS

| JP | 4-24917 A | 1/1992 |
| JP | 5-144825 A | 6/1993 |

(Continued)

OTHER PUBLICATIONS

Machine Translation of JPH05144825.*
(Continued)

*Primary Examiner* — Tu B Hoang
*Assistant Examiner* — Erin E McGrath
(74) *Attorney, Agent, or Firm* — Buchanan Ingersoll & Rooney PC

(57) ABSTRACT

A vacuum processing apparatus according to this invention includes a heating unit arranged to face a processing surface of a substrate supported by a substrate support unit in a vacuum chamber, a cooling unit arranged to face a reverse surface of the substrate supported by the substrate support unit, a temperature correction unit configured to correct a temperature of a periphery of the substrate in order to reduce a temperature difference between a central portion and the periphery of the substrate by being arranged in a predetermined position between the substrate and the cooling unit when the heating unit heats the substrate, and a correction unit moving device configured to retract the temperature correction unit from the predetermined position.

10 Claims, 14 Drawing Sheets

(51) Int. Cl.
  *H01L 21/687* (2006.01)
  *F27D 7/06* (2006.01)
  *F27D 15/02* (2006.01)
  *C23C 14/54* (2006.01)

(52) U.S. Cl.
  CPC .......... *F27D 15/02* (2013.01); *H01L 21/6719* (2013.01); *H01L 21/67109* (2013.01); *H01L 21/67115* (2013.01); *H01L 21/68707* (2013.01); *F27D 2007/066* (2013.01)

(58) Field of Classification Search
  CPC .......... H01L 21/68707; H01L 21/6719; H01L 21/67098; H01L 21/68; H01L 21/683; H01L 23/34; C23C 14/541
  USPC .......................................................... 392/416
  See application file for complete search history.

(56) References Cited

FOREIGN PATENT DOCUMENTS

| JP | 8-69977 A | 3/1996 |
|---|---|---|
| JP | 2003-17430 A | 1/2003 |
| JP | 2007-12846 A | 1/2007 |
| KR | 10-0576929 | 5/2006 |
| KR | 10-2011-0074598 A | 6/2011 |
| TW | 201135845 A1 | 10/2011 |
| WO | WO 2011/043490 A1 | 4/2011 |

OTHER PUBLICATIONS

Machine Translation of JP2003017430.*
Office Action (Notice of Preliminary Rejection) dated Feb. 1, 2017, by the Korean Intellectual Property Office in corresponding Korean Patent Application No. 10-2016-7000240 and an English Translation of the Office Action. (10 pages).
Office Action dated Dec. 22, 2015, by the Taiwanese Patent Office in corresponding Taiwanese Patent Application No. 103120024, and an English translation of the Office Action. (6 pages).
International Search Report (PCT/ISA/210) dated Jun. 3, 2014, by the Japanese Patent Office as the International Searching Authority for International Application No. PCT/JP2014/001181.
Written Opinion (PCT/ISA/237) dated Jun. 3, 2014, by the Japanese Patent Office as the International Searching Authority for International Application No. PCT/JP2014/001181.

* cited by examiner

F I G. 1
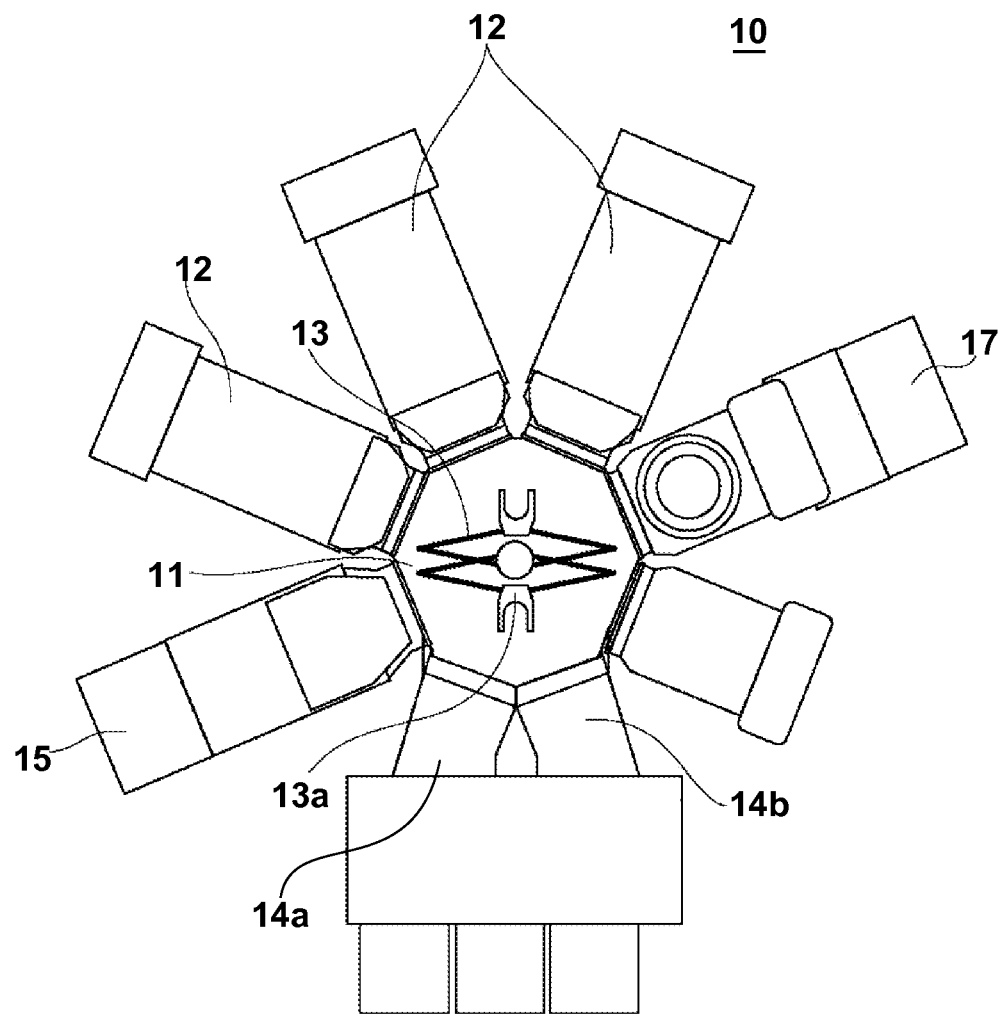

F I G. 4
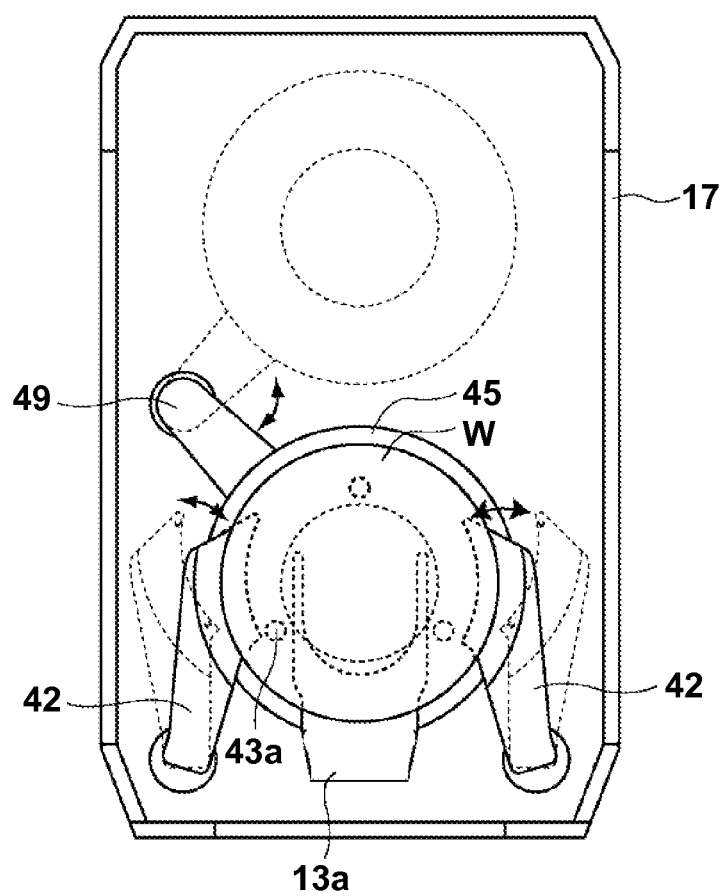

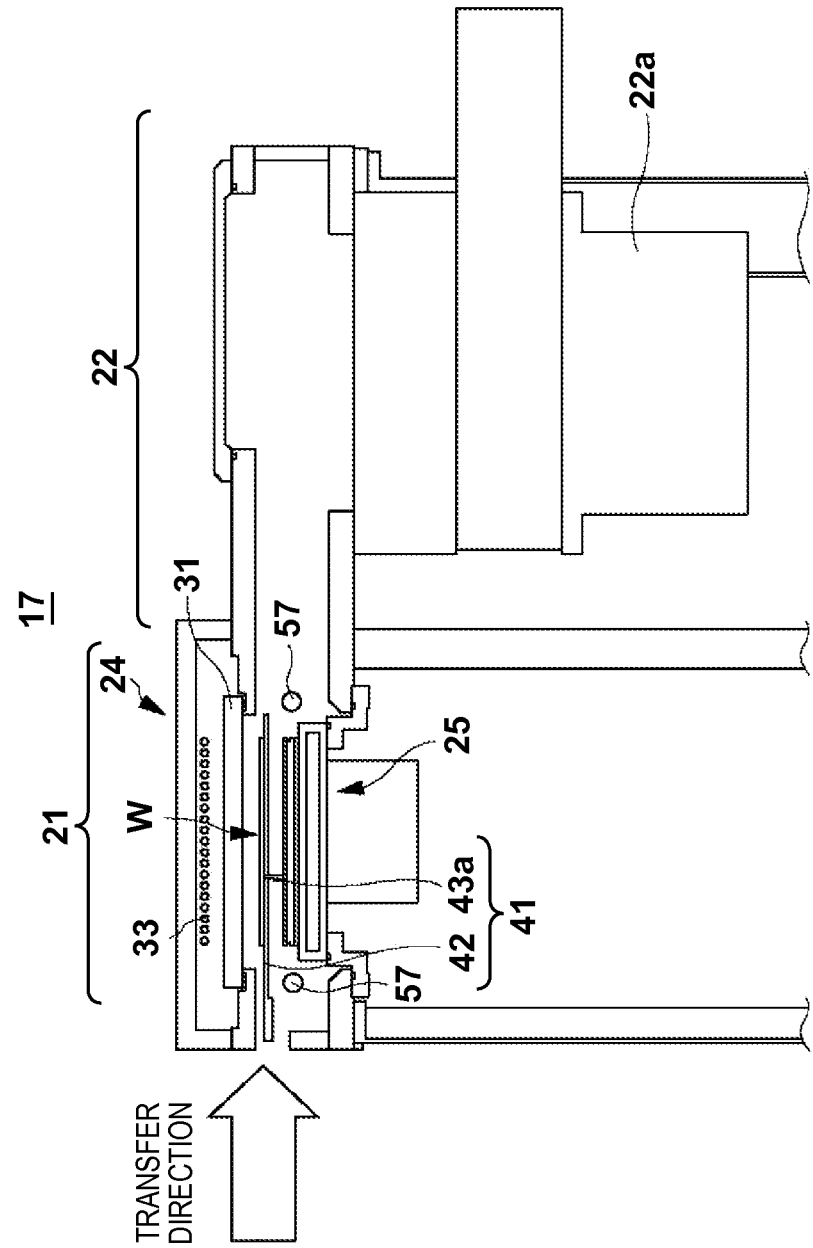

VACUUM PROCESSING DEVICE

This application is a continuation of International Patent Application No. PCT/JP2014/001181 filed on Mar. 4, 2014, and claims priority to Japanese Patent Application No. 2013-122527 filed on Jun. 11, 2013, the entire content of both of which is incorporated herein by reference.

TECHNICAL FIELD

The present invention relates to a vacuum processing device and, more particularly, to a vacuum processing device which heats a substrate in a vacuum and then cools the substrate.

BACKGROUND ART

A vacuum processing device for heating a substrate in an ultrahigh vacuum ambient includes, for example, an infrared lamp arranged above a substrate supported in a vacuum chamber with a quartz window being interposed between them, and a vertically movable cooling member arranged below the substrate, and performs a heating/cooling process by bringing the heated substrate into tight contact with the cooling member (see, for example, PTL 1).

CITATION LIST

Patent Literature

PTL 1: Japanese Patent Laid-Open No. 8-69977

SUMMARY OF INVENTION

Technical Problem

In this technique, the quartz window arranged between the substrate and the infrared lamp makes it difficult to arrange the infrared lamp near the substrate. In the heating process, therefore, it is difficult to irradiate the periphery of the substrate with infrared light similar to the central portion. Conventionally, the in-plane temperature uniformity of the substrate is obtained by uniformly irradiating the entire surface of the substrate with infrared light by using a lamp larger than the size of the substrate. However, the size of the vacuum chamber increases because the large heating lamp is used, and this makes it difficult to reduce a footprint.

It is an object of the present invention to solve the problem of the above-described prior art, and provide a vacuum processing device capable of maintaining the temperature uniformity of a substrate while reducing a footprint.

Solution to Problem

A vacuum processing device according to the present invention is characterized by including a vacuum chamber; a substrate supporting unit configured to support a substrate in the vacuum chamber; a heating unit arranged to face a processing surface of the substrate supported by the substrate supporting unit; a cooling unit arranged to face a reverse surface of the substrate supported by the substrate supporting unit; a temperature correction unit configured to correct a temperature of a periphery of the substrate in order to reduce a temperature difference between a central portion and the periphery of the substrate by being arranged in a predetermined position between the substrate supported by the substrate supporting unit and the cooling unit when the heating unit heats the substrate; and a correction unit moving unit configured to move the temperature correction unit between the predetermined position and a retraction position retracted from the predetermined position.

Advantageous Effects of Invention

The vacuum processing device according to the present invention can provide a vacuum processing device capable of maintaining the temperature uniformity of a substrate while reducing a footprint.

BRIEF DESCRIPTION OF DRAWINGS

FIG. 1 is a plan view showing a typical arrangement of a deposition apparatus to which a vacuum processing device according to the present invention is attached;

FIG. 4 is a sectional view taken along a line A-A in FIG. 3;

FIG. 14 is a schematic sectional view of a vacuum processing device according to the third embodiment.

DESCRIPTION OF EMBODIMENTS

Figure 2:
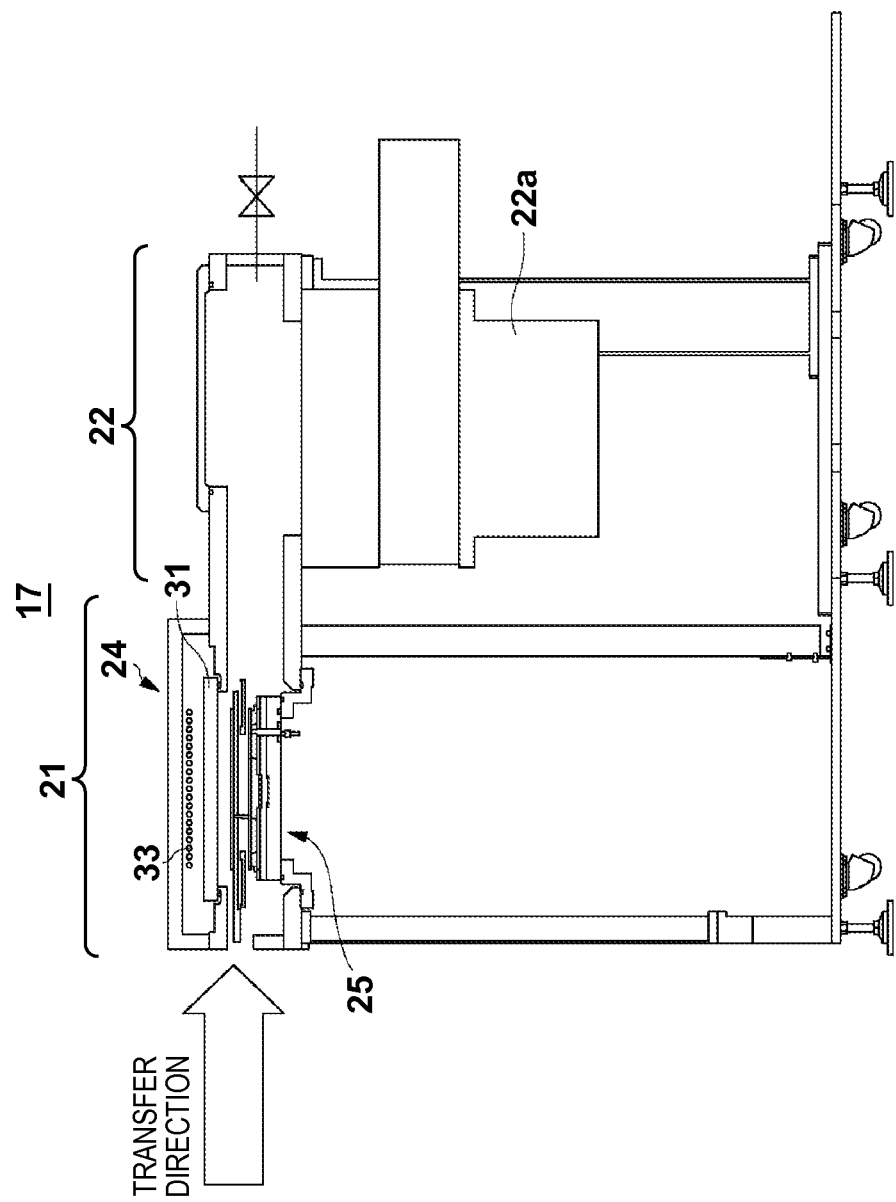
FIG. 2 is a schematic sectional view of the vacuum processing device according to the present invention.

Preferred embodiments of the present invention will be explained below with reference to the accompanying drawings. Members, arrangements, and the like to be explained below are examples embodying the present invention and do not limit the invention, so various modifications can, of course, be made without departing from the spirit and scope of the invention.

First Embodiment

FIG. 1 is a plan view showing a typical arrangement of a deposition apparatus 10 to which a vacuum processing device according to the present invention is attached. The deposition apparatus 10 is a cluster type apparatus and includes a plurality of deposition chambers 12. A transfer chamber 11 equipped with a robot transfer device 13 is installed in the center. The robot transfer device 13 can place a substrate on a hand 13a of an expandable arm. The end portion of the arm is rotatably attached to the central portion of the transfer chamber 11.

A load chamber 14a and unload chamber 14b are connected to the transfer chamber 11 of the deposition apparatus 10. A substrate as a material to be processed is externally loaded into the deposition apparatus 10 via the load chamber 14a, and a substrate having undergone a multilayered film deposition process is unloaded outside the deposition apparatus 10 from the unload chamber 14b.

In the deposition apparatus 10, three deposition chambers 12, a cleaning chamber 15, and a heating/cooling chamber 17 are connected around the transfer chamber 11 (a transfer chamber). Between two adjacent chambers, an openable/closable gate valve for isolating the two chambers is arranged.

Each deposition chamber 12 is a deposition chamber for depositing a film of an element to be used in a device. In this embodiment, a multilayered film to be deposited on a substrate is divided into a plurality of groups, and a plurality of films belonging to each group are deposited in a preset deposition chamber. Each deposition chamber 12 forms a film by a PVD (Physical Vapor Deposition) method using sputtering. Note that it is, of course, possible to improve the throughput by arranging a plurality of deposition chambers for depositing films belonging to the same group. The cleaning chamber 15 is a chamber which performs surface planarization by using an ion beam etching mechanism or RF sputtering etching mechanism.

The heating/cooling chamber 17 is a vacuum chamber of the vacuum processing device having the feature of the present invention, and performs annealing of a layer deposited in one of the three deposition chambers 12. The heating/cooling chamber 17 heats a substrate and then cools it, thereby improving the throughput and reducing the occlusion of an impure gas caused by cooling in a high vacuum. The heating/cooling chamber 17 will be described later.

In the deposition apparatus 10, a substrate loaded inside via the load chamber 14a is supplied to each deposition chamber 12 by the robot transfer device 13 in an order predetermined in accordance with a multilayered film device as a formation target, and each deposition chamber 12 performs a predetermined deposition process. Examples of the multilayered film device as a formation target are an LED, LOGIC, DRAM, MRAM, TMR head, and advanced (improved) GMR.

Note that FIG. 1 does not show any of an evacuating device for setting a necessary vacuum state in the deposition chamber 12, a power supply device for supplying electric power to be applied to a target electrode, a target attached to each target electrode, and a device for generating plasma such as a process gas supply mechanism.

It is also possible to install a processing device having a function necessary for the device configuration, for example, an oxide film deposition chamber or dry etching chamber. The oxide film deposition chamber is a chamber which performs a surface chemical reaction for oxidizing a metal layer. The surface chemical reaction uses plasma oxidation, natural oxidation, ozone oxidation, ultraviolet-ozone oxidation, or radical oxygen. The dry etching chamber is a chamber in which a part of a film deposited in one of the deposition chambers 12 is etched with an ion beam. The deposition chambers 12 of this embodiment have the same arrangement. However, it is, of course, possible to change the type of target to be attached to the target electrode of each deposition chamber in accordance with the film configuration of a multilayered film device as a formation target.

The characteristic structure of the heating/cooling chamber 17 will be explained with reference to FIGS. 2, 3, and 4. FIG. 2 is a schematic sectional view showing the heating/cooling chamber 17 sideways. The heating/cooling chamber 17 is a vacuum chamber including a heating/cooling room 21 and pump room 22. The heating/cooling room 21 is connected to the transfer chamber 11 via a gate valve, so the robot transfer device 13 can transfer a substrate between the transfer chamber 11 and heating/cooling room 21. The interior of the pump chamber 22 communicates with the heating/cooling room 21. The pump room 22 includes an exhaust device which is a vacuum pump 22a for evacuating the heating/cooling chamber 17. In addition, a ventilation mechanism for exposing the pump room 22 to the atmosphere during maintenance is connected to the pump room 22.

Figure 3:
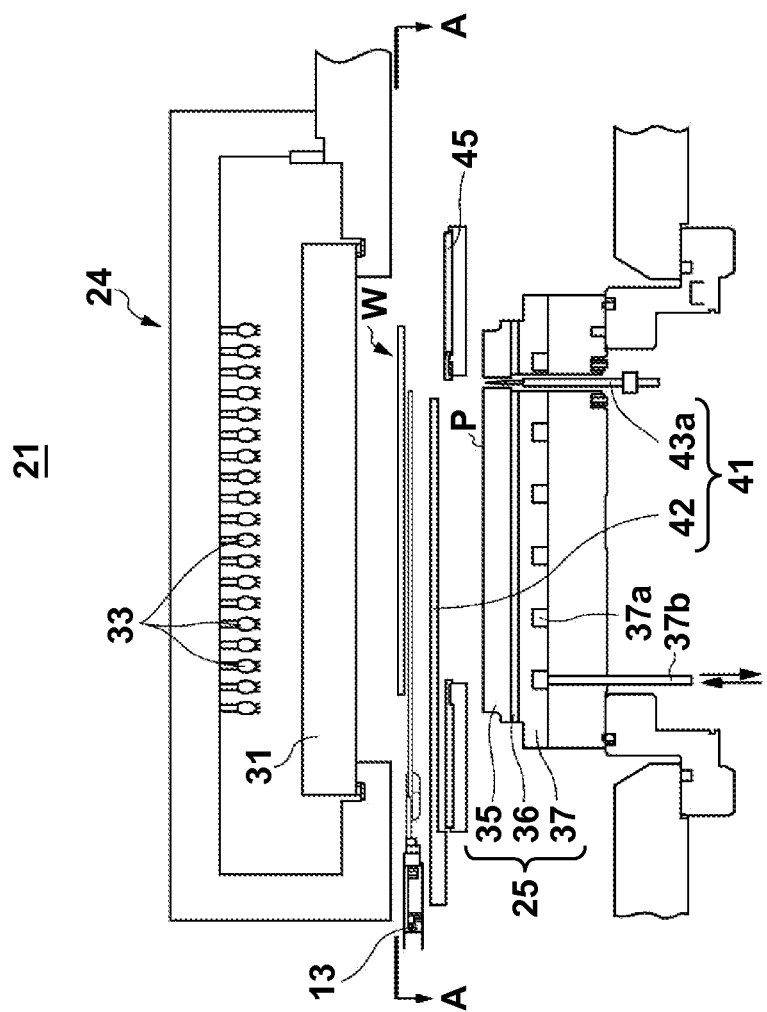
FIG. 3 is a schematic sectional view of a heating/cooling room of the vacuum processing device according to the present invention.

FIG. 3 is a schematic sectional view of the heating/cooling room 21. FIG. 4 is a sectional view of the heating/cooling room 21 in the horizontal direction (the direction of an A-A section in FIG. 3). The heating/cooling room 21 includes a heating unit 24 for heating the processing surface of the substrate, a cooling unit (substrate holder 25) for cooling a substrate, a temperature correction unit 45 for preventing a temperature drop in the periphery of the substrate when a heating unit 24 heats the substrate, a correction unit moving device 49 for moving the temperature correction unit 45, and a substrate support unit 41 capable of moving the substrate in the gravity direction while supporting the substrate. In an opening formed in the upper portion of the heating/cooling room 21, a transparent window 31 made of transparent quartz is airtightly fitted in the chamber (vacuum chamber) of the heating/cooling room 21. The heating unit 24 includes a heating lamp 33 and is arranged on the atmospheric side of the transparent window 31. The heating lamp 33 of this embodiment is an infrared lamp, but any lamp can be used as long as it can heat a substrate through the transparent window 31.

The substrate holder 25 to be used as the cooling unit for cooling a substrate includes a substrate placement unit 35 for placing a substrate on it, and a cooling device 37 for cooling a substrate W supported on a substrate placement surface P of the substrate placement unit 35. The cooling device 37 is installed on that side of the substrate placement unit 35, which is opposite to the substrate placement surface P, and is so configured as to cool the substrate placement surface P. The cooling device 37 of this embodiment is a water-cooling block in which a water channel 37a for circulating a coolant such as cooling water is formed. A cooling water circulating device (not shown) is connected to the water channel 37a of the cooling device 37 via a hose 37b for circulating the cooling water. Note that the cooling device 37 may also be a unit separated from the substrate placement unit 35 as long as the unit can cool the substrate placement unit 35. It is also possible to use a GM refrigerator, a Stirling refrigerator, or a device using a Peltier element.

The substrate placement unit 35 includes an ESC (Electro Static Chucking), and can bring the substrate W into tight contact with the cooled substrate placement surface P. A groove capable of circulating a cooling gas between the substrate placement surface P and the reverse surface of the substrate W is formed in the substrate placement surface P. When the substrate W is placed on the substrate placement surface P, the reverse surface side of the substrate W can be cooled by the cooling gas flowing through the groove. Since the substrate placement surface P is cooled by the cooling device 37, the substrate W can rapidly be cooled by the cooling gas when the substrate W is placed on the substrate placement surface P of the substrate placement unit 35. Note that a carbon sheet 36 is sandwiched between the substrate placement unit 35 and the cooling device so as to decrease the thermal resistance between them.

The substrate support unit 41 includes a first support unit 42 for supporting the substrate W in a position near the heating unit 24, and a second support unit for supporting the substrate in a position close to the cooling unit (substrate holder 25). The second support unit includes three lift pins 43a. The three lift pins 43a rise and support the reverse surface of the substrate W. When the lift pins 43a supporting the substrate W move down and the distal ends of the lift pins 43a become lower than the substrate placement surface P, the substrate W is placed on the substrate placement surface P. The first support unit 42 is a member for supporting the substrate in a position (heating position) where the heating unit 24 heats the substrate. Since the first support unit 42 is positioned at a height within the vertical motion range of the hand 13a in the heating/cooling room 21, the first support unit 42 can receive the substrate placed on the hand 13a of the robot transfer device 13 in the heating/cooling room 21.

The first support unit 42 can horizontally move and transfer the substrate W to the lift pins 43a having moved toward the heating unit 24. The first support unit 42 of this embodiment is divided into two units, and these two units can move in directions (arrow directions in FIG. 4) away from each other, so as not to come in contact with the substrate W which is supported by the lift pins 43a and moves toward the cooling unit (substrate holder 25). Also, each of the two divided first support units 42 has a projection which abuts against the surface opposite to the deposition surface of the substrate W. It is possible to form one or a plurality of (for example, two) projections on each first support unit 42. This point contact between the reverse surface of the substrate W and the projection can prevent heat dissipation from the substrate W to the first support unit 42.

The three lift pins 43a extend through the substrate placement unit 35 and cooling device 37 so as to be movable in the gravity direction. The three lift pins 43a move in synchronism with each other, receive the substrate W supported by the first support unit 42 in a position where the substrate W is heated, and moves in the gravity direction to a position where the substrate W is placed on the substrate placement surface P of the substrate placement unit 35. A lifting device (not shown) for vertically moving the lift pins 43a is installed below the cooling device 37.

The temperature correction unit 45 includes a ring-like plate member (heat storage ring) made of SiC, and can store heat from the heating lamp 33. The temperature correction unit 45 is arranged on the reverse side of the substrate W, and produces a difference between the heat radiation states of the periphery and central portion of the substrate, thereby suppressing a temperature drop in the periphery of the substrate W. A temperature drop caused by radiation is dominant especially in a vacuum. Therefore, a temperature difference between the periphery and central portion of the substrate W can be decreased by arranging the heat storage ring having a small temperature difference from the substrate W during heating, near a portion (the periphery) of the substrate W where a temperature drop must be prevented.

The temperature correction unit 45 and heat storage ring of this embodiment have a round ring-like shape, but the shape can be changed in accordance with the temperature distribution of the substrate W as a target of temperature correction. For example, the size and shape of the central opening of the temperature correction unit 45 can be changed in accordance with the degree of a temperature drop in the periphery of the substrate W. The heat storage ring has a diameter larger than that of the substrate W. Since the heat storage ring is so arranged as to face the reverse surface of the substrate W when it is heated, the temperature correction unit 45 can suppress a temperature drop in the periphery of the substrate W under heating. Note that the position where the temperature correction unit 45 is arranged while the substrate W is heated will be called a predetermined position hereinafter.

The correction unit moving device 49 is a device for horizontally moving the temperature correction unit 45. When cooling the substrate W by the cooling unit (substrate holder 25), the correction unit moving device 49 can retract the temperature correction unit 45 from between the substrate W supported by the lift pins 43a and the cooling unit (substrate holder 25). The correction unit moving device 49 can position the temperature correction unit 45 below the substrate W when it is heated, and move the temperature correction unit 45 toward the pump room 22 when the heating process of the substrate W is complete. Since the correction unit moving device 49 can retract the temperature correction unit 45 to a position where the lift pins 43a are not in contact with the temperature correction unit 45, the movement of the substrate W by the lift pins 43a is not obstructed. Accordingly, the shape of the temperature correction unit 45 is not restricted by the lift pins 43a. Note that the position where the temperature correction unit 45 is not in contact with the lift pins 43a and substrate W will be called a retraction position hereinafter. The temperature correction unit 45 indicated by the broken lines in FIG. 4 shows the retraction position of the temperature correction unit 45 moved by the correction unit moving device 49.

Figure 5:
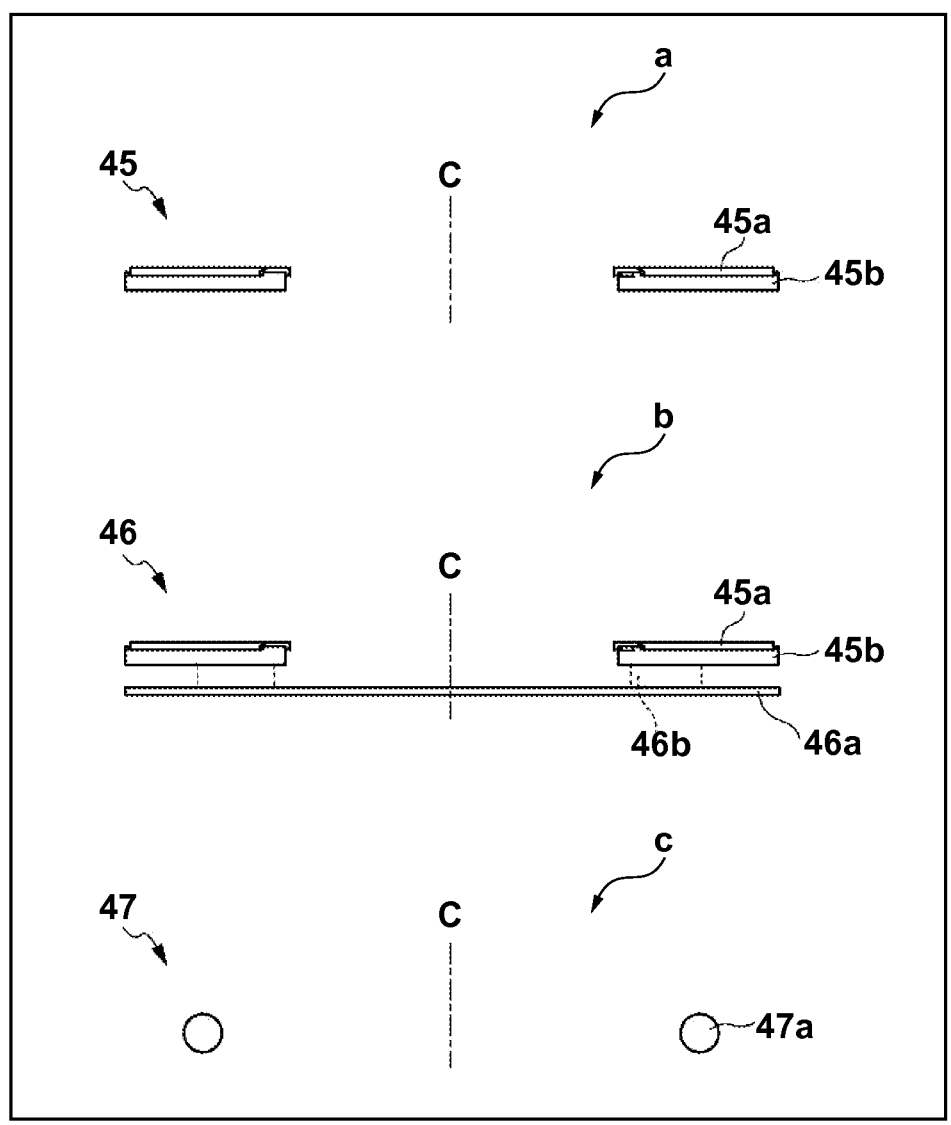
FIG. 5 is a view for explaining the operation of a vacuum processing device according to the first embodiment.

FIG. 5 is an enlarged sectional view of the temperature correction unit. C in FIG. 5 is a central line of the temperature correction unit. a in FIG. 5 is a sectional view of the temperature correction unit 45 of this embodiment. Main constituent elements are a ring-like heat storage member 45a made of SiC, and a connecting member 45b which supports the heat storage member 45a and connects to the correction unit moving device 49.

b in FIG. 5 shows another configuration example 1 of the temperature correction unit. A temperature correction unit 46 as another configuration example of the temperature correction unit includes a disk-like heat blocking plate 46a for blocking infrared light from the heating lamp 33, which passes through the central opening of the heat storage ring during pre-heating. In this case, the temperature correction unit 46 has a double structure: the heat storage member 45a is arranged close to the heating lamp 33, and the heat blocking plate 46a is arranged on the cooling unit side of the heat storage member 45a. The heat blocking plate 46a blocks heat radiated from the heating lamp 33. Since the heat blocking plate 46a can prevent infrared light from irradiating the cooling unit (substrate holder 25) during pre-heating, temperature management of the cooling unit (substrate holder 25) becomes easy. Note that when a spacer 46b is inserted between the heat storage member 45a and heat blocking plate 46a, an inflow of heat from the heat storage member 45a to the heat blocking plate 46a can be reduced.

An opening for dissipating heat from the substrate W during the heating process may also be formed in the heat blocking plate 46a. For example, if the temperature of a part of the substrate W is high in the heating process, heat can be dissipated from the reverse surface of the high-temperature portion of the substrate W during the heating process by notching a part of the heat blocking plate, which is positioned below the high-temperature portion of the substrate W. This can make the temperature distribution of the substrate W more uniform.

c in FIG. 5 shows another configuration example 2 of the temperature correction unit. A temperature correction unit 47 as another configuration example of the temperature correction unit includes a heating lamp 47a as an auxiliary heater (heater) capable of directly heating the reverse surface of the substrate periphery when heating the substrate. The heating lamp 47a has a ring-like shape and directly heats the reverse surface of the substrate periphery. This makes it possible to make the temperature distribution of the substrate W more uniform by controlling the output. Note that the heat storage member 45a may also be arranged on the cooling unit side of the heating lamp 47a. When the heat storage member 45a is arranged on the cooling unit side of the heating lamp 47a, pre-heating can be performed in the pump room 22.

Figure 6:
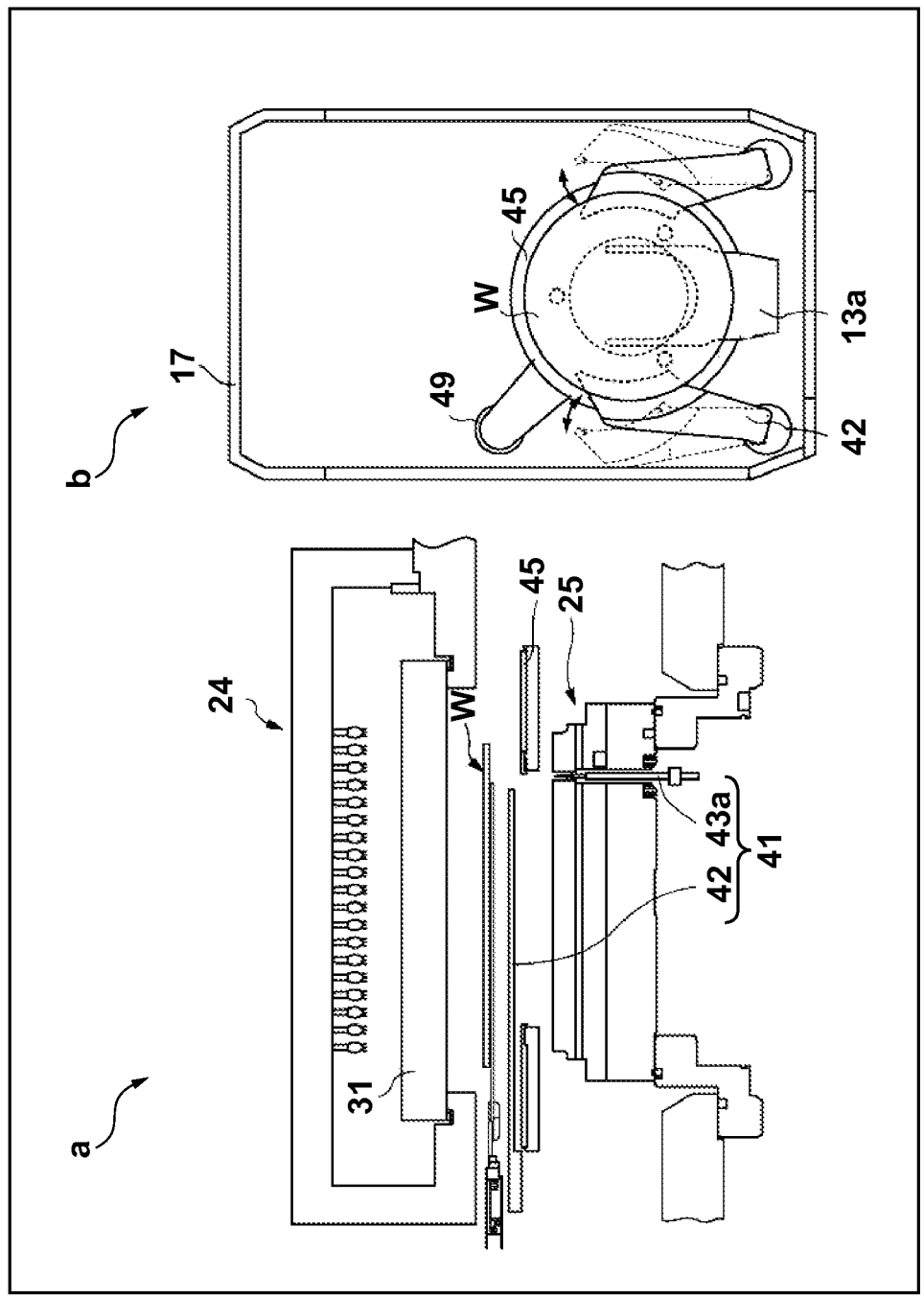
FIG. 6 is a view for explaining the operation of the vacuum processing device according to the first embodiment.

The operation of the heating/cooling chamber will be explained with reference to FIGS. 6 to 12. In each of FIGS. 6 to 12, view a is a schematic sectional view of the heating/cooling room in the horizontal direction, and view b is a sectional view taken along a line A-A in FIG. 3. FIG. 6 shows the state of each unit when loading the substrate W into the heating/cooling chamber 17. The substrate W before annealing is placed on the hand 13a of the robot transfer device 13. The first support unit 42 is in a position where it supports the substrate W, and the substrate W is transferred onto the first support unit 42 when the hand 13a of the robot transfer device 13 moves in the gravity direction. The temperature correction unit 45 is positioned below the first support unit 42. The lift pins 43a are positioned in the lower-limit position, and the distal ends of the lift pins 43a are positioned below the substrate placement surface P.

Figure 7:
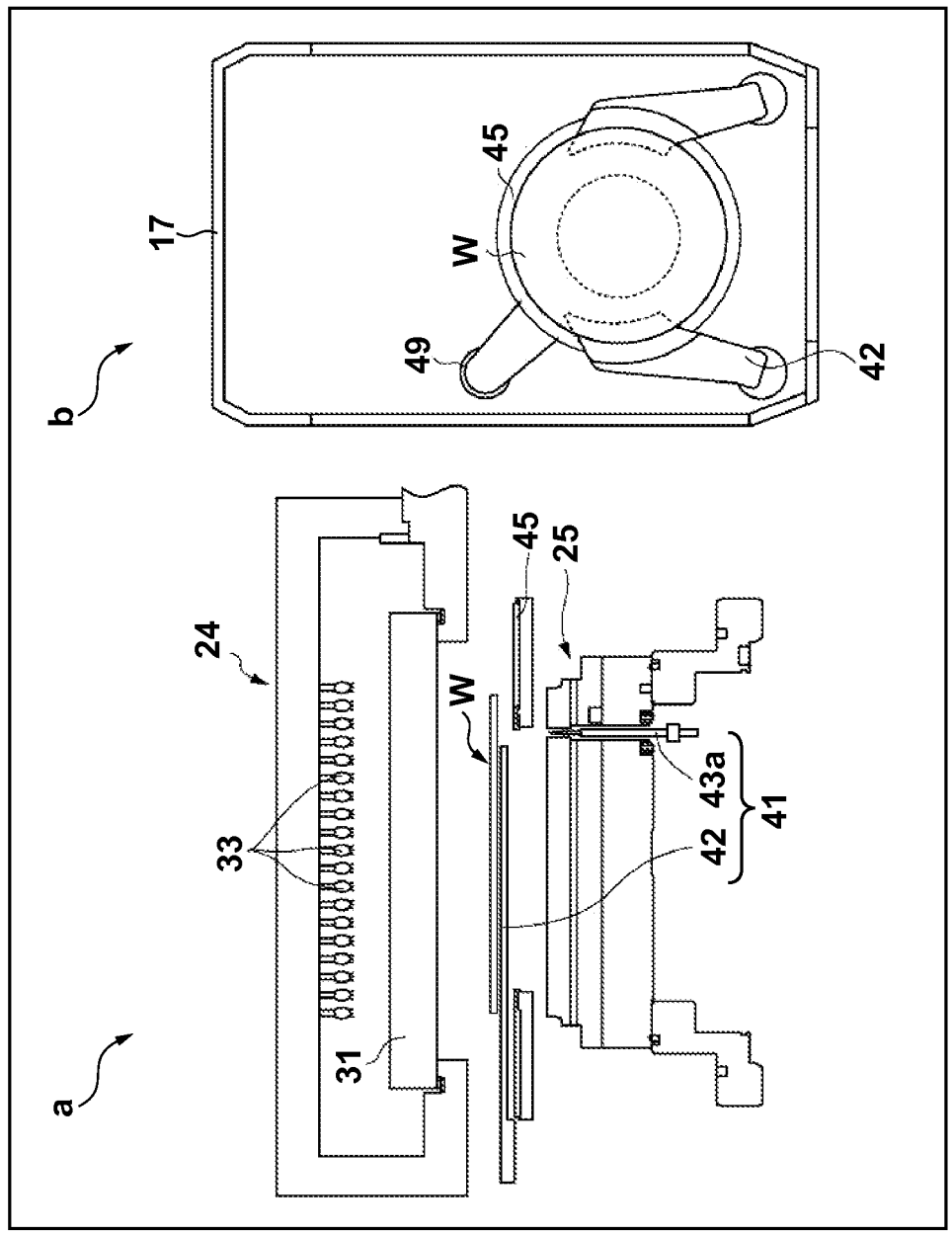
FIG. 7 is a view for explaining the operation of the vacuum processing device according to the first embodiment.
Figure 8:
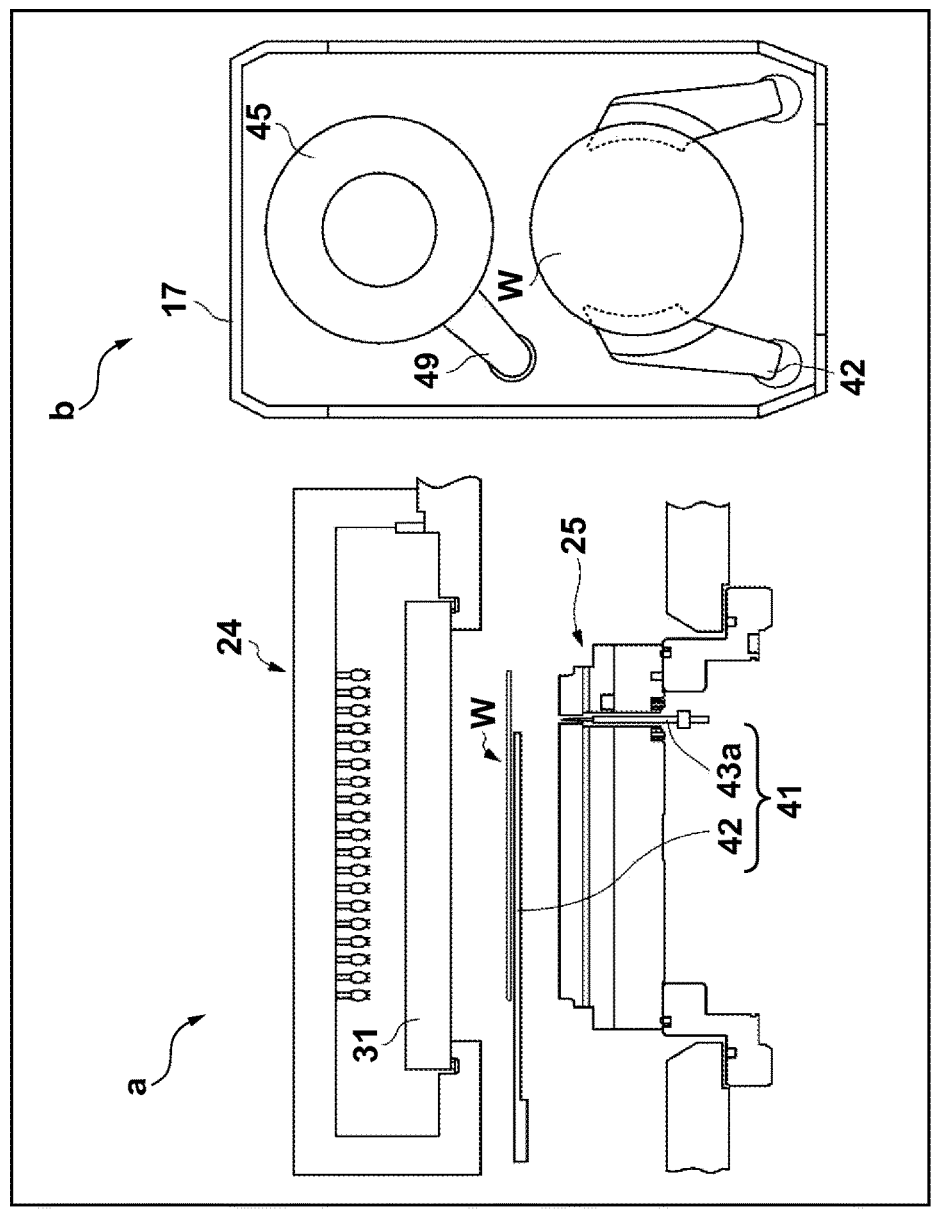
FIG. 8 is a view for explaining the operation of the vacuum processing device according to the first embodiment.

FIG. 7 shows the state of each unit when the heating unit heats the loaded substrate W. The first support unit 42 has not moved from the position where it has received the substrate W from the hand 13a. Note that the position where the heating unit 24 heats the substrate W is a substrate heating position (heating position). The heating lamp 33 of the heating unit 24 heats the deposition surface side of the substrate W. In this state, the heated temperature correction unit 45 is arranged on the reverse side of the periphery of the substrate W, and reduces heat dissipation from the substrate periphery. The temperature correction unit 45 corrects a temperature of a periphery of the substrate in order to reduce a temperature difference between a central portion and the periphery of the substrate by being arranged in a predetermined position between the substrate W supported by the first support unit 42 and the cooling unit (substrate holder 25). This correction by the temperature correction unit 45 makes it possible to prevent a temperature drop in the periphery of the substrate W, reduce the temperature difference between the central portion and periphery of the substrate W, and make the temperature distribution of the substrate W uniform. FIG. 8 shows the state of each unit after the heating process of the substrate W is complete. The temperature correction unit 45 is retracted in the pump room 22 by the correction unit moving device 49.

Figure 9:
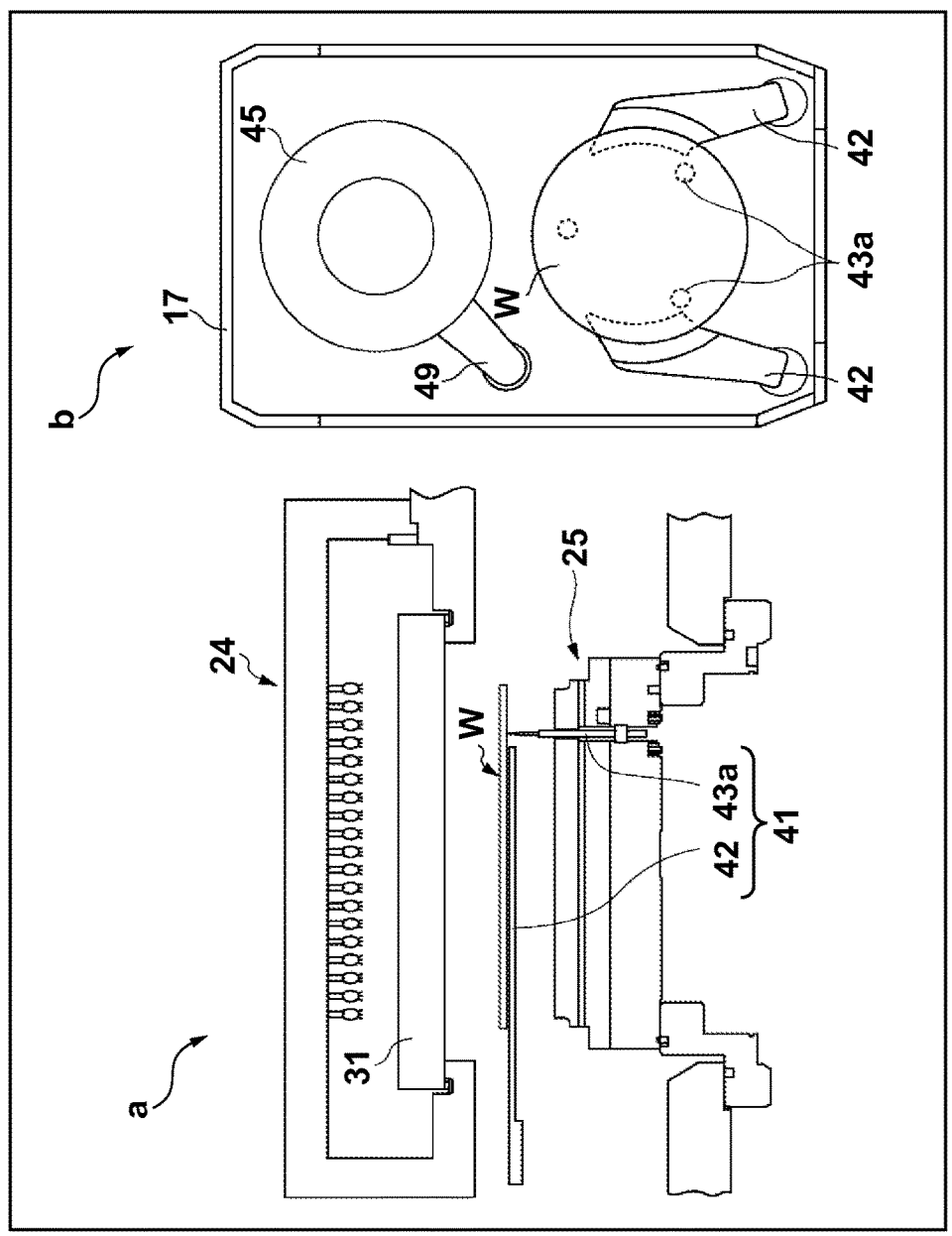
FIG. 9 is a view for explaining the operation of the vacuum processing device according to the first embodiment.
Figure 10:
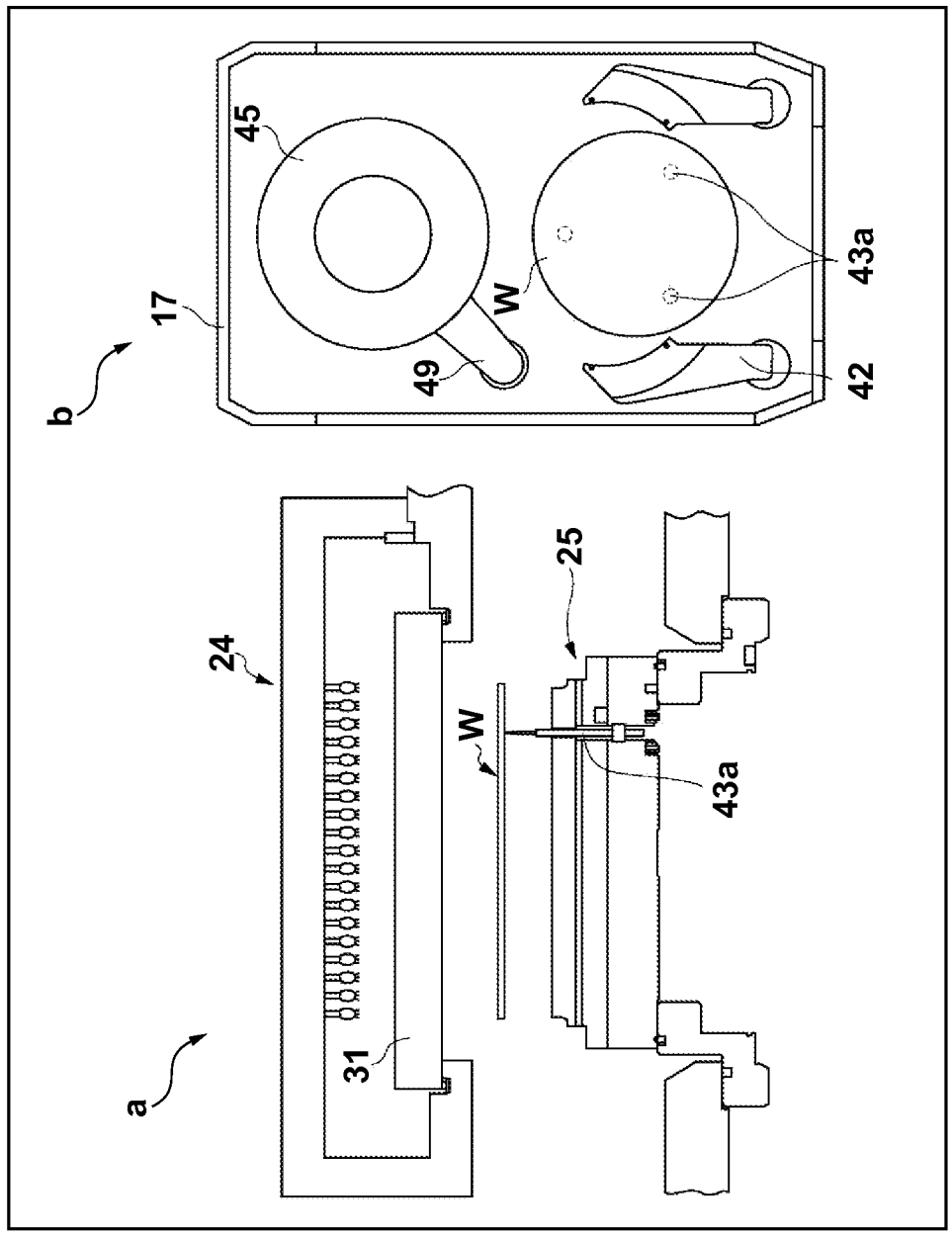
FIG. 10 is a view for explaining the operation of the vacuum processing device according to the first embodiment.
Figure 11:
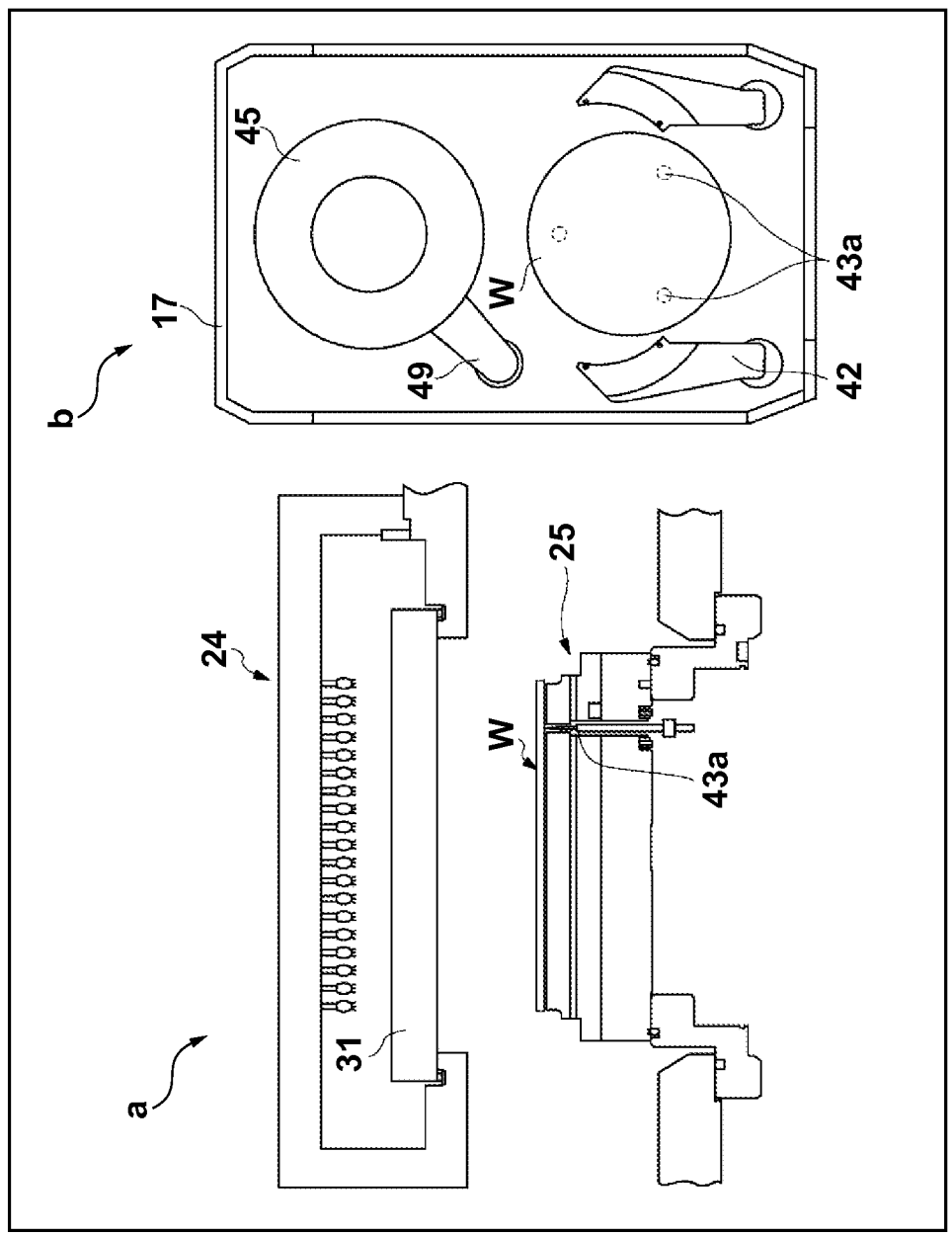
FIG. 11 is a view for explaining the operation of the vacuum processing device according to the first embodiment.

FIGS. 9 to 11 each show the state of each unit after the temperature correction unit 45 is retracted from below the substrate W. The lift pins 43a support the substrate W by pushing its reverse surface upward (FIG. 9). Then, the first support unit 42 retracts from the reverse surface of the substrate W (FIG. 10). After that, the lift pins 43a supporting the substrate W move in the gravity direction, thereby placing the substrate W on the substrate placement surface P of the substrate placement unit 35 (FIG. 11). The position where the substrate W is placed on the substrate placement surface P is a substrate cooling position (cooling position). A process of cooling the substrate W is performed in this cooling position.

After the cooling process of the substrate W is complete, the lift pins 43a move the processed substrate W upward, and transfer the substrate W to the first support unit 42. The processed substrate W is transferred from the lift pins 43a to the hand 13a. Note that it is also possible to transfer the processed substrate W from the lift pins 43a to the hand 13a via the first support unit 42. The processed substrate W moved from the heating/cooling chamber 17 to the transfer chamber 11 by the robot transfer device 13 is unloaded from the deposition apparatus 10, or undergoes next vacuum processing in the deposition chamber 12 or the like.

Figure 12:
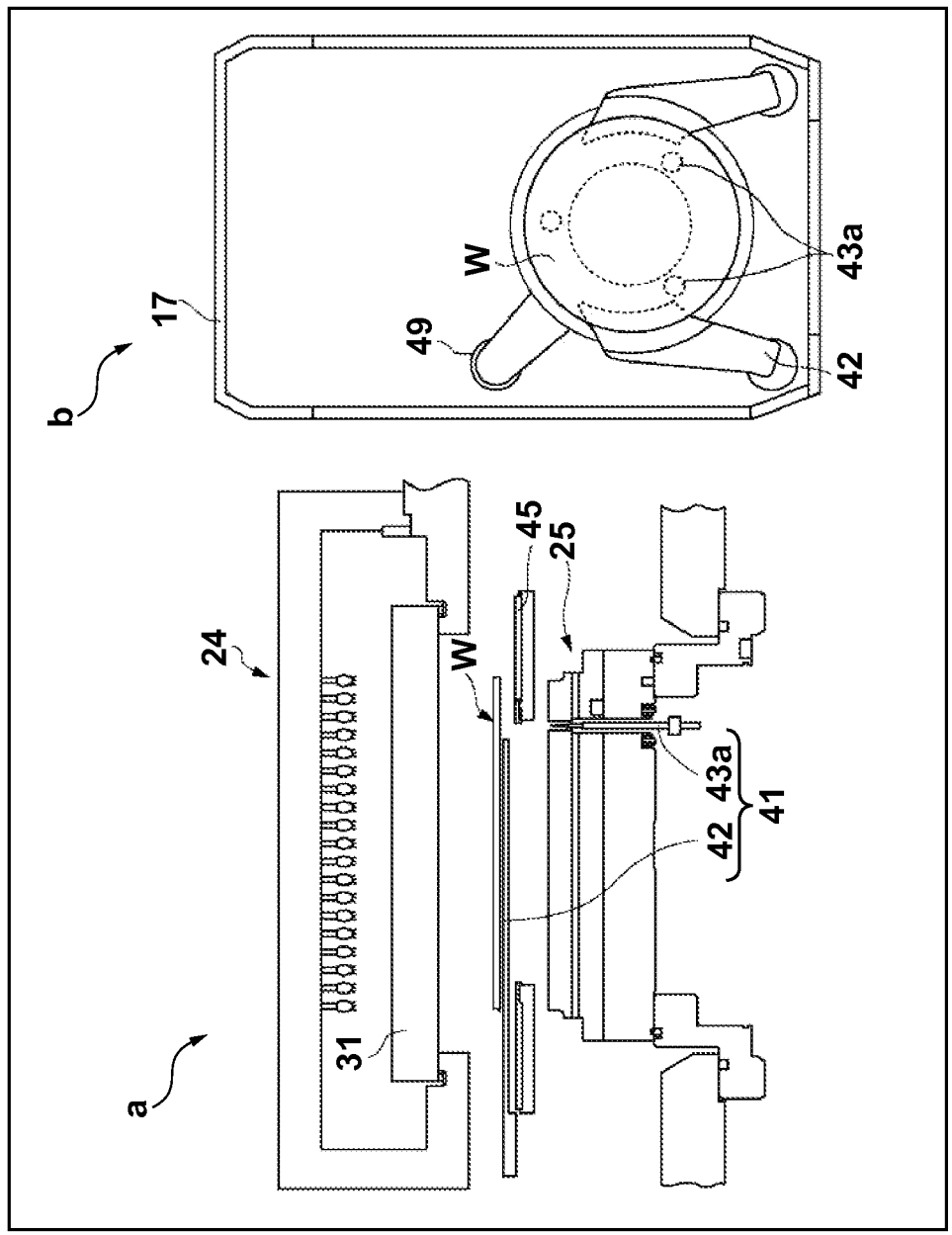
FIG. 12 is a view for explaining the operation of the vacuum processing device according to the first embodiment.

FIG. 12 shows the layout of the individual units when pre-heating the temperature correction unit 45. The temperature correction unit 45 is pre-heated while the processed substrate W is unloaded from the heating/cooling chamber 17 and a substrate to be processed next is loaded into the heating/cooling chamber 17. That is, the processed substrate W is transferred from the lift pins 43a to the first support unit 42. After the lift pins 43a move down, the temperature correction unit 45 is moved to a position below the heating lamp 33, and heated by the heating lamp 33. Consequently, it is possible to store heat in the SiC heat storage ring of the temperature correction unit 45, and perform the heating process of the next substrate more rapidly.

The heating/cooling chamber 17 according to the present invention heats a substrate and then cools it, and hence can improve the throughput and reduce the occlusion of an impure gas caused by cooling in a high vacuum. In addition, the heat treatment by the heating/cooling chamber 17 makes it possible to control the crystalline state of a deposited layer, and improve the adhesion between the substrate and the film.

Figure 13:
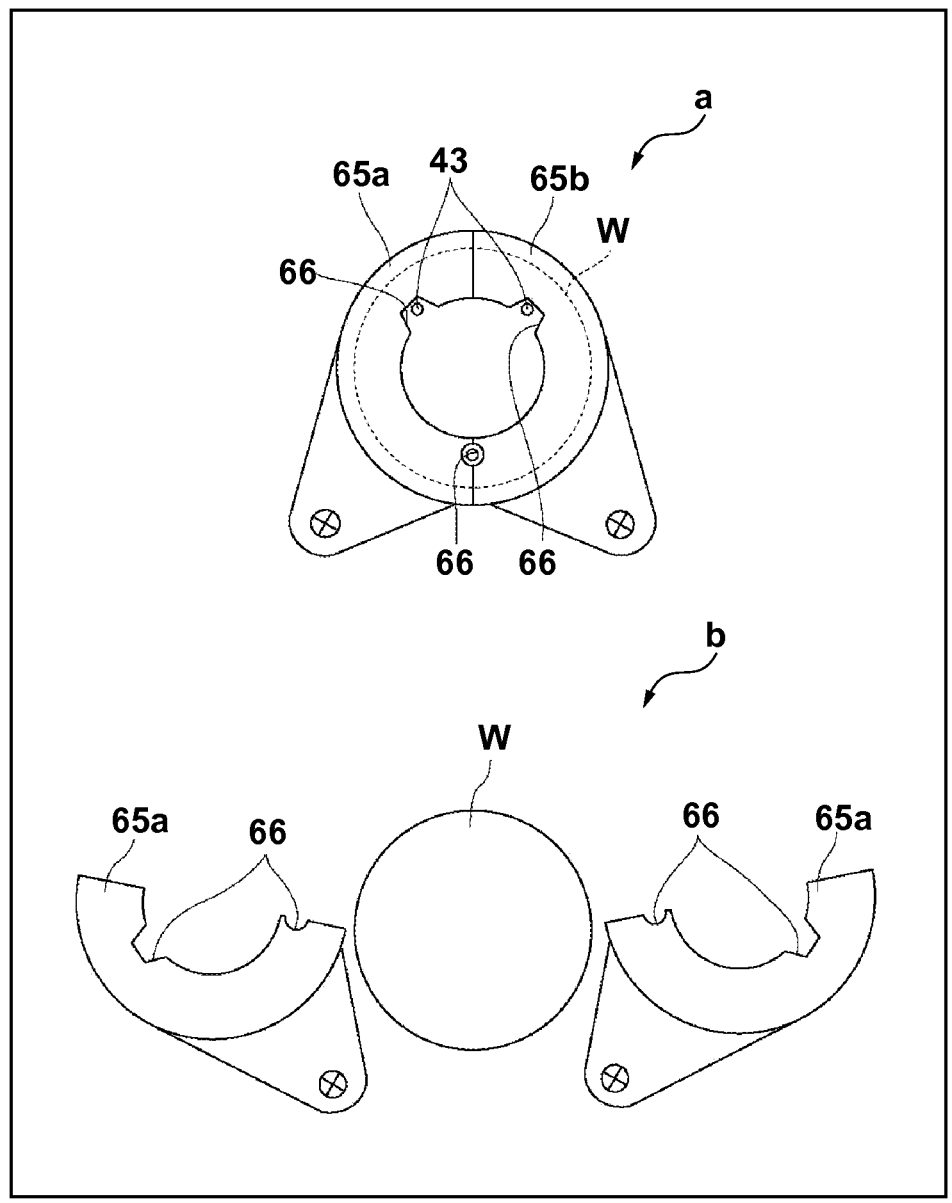
FIG. 13 is a schematic sectional view of a vacuum processing device according to the second embodiment.

Second Embodiment a and b in FIG. 13 are sectional views of a heating/cooling chamber according to the second embodiment. The heating/cooling chamber 17 according to the above-described first embodiment includes the integrated ring-like temperature correction unit 45. The heating/cooling chamber of this embodiment includes a temperature correction unit 45 divided into two segments 65a and 65b. A heat storage member is also divided into the segments 65a and 65b. Each of the segments 65a and 65b has notches 66 so as not to interfere with lift pints 43a. Projections for supporting a substrate W may also be formed on the segments 65a and 65b. In this case, a first support unit 42 is formed in the temperature correction unit. Since the temperature correction unit can support the substrate W like the first support unit 42, the first support unit 42 is unnecessary.

Third Embodiment

FIG. 14 is a sectional view of a heating/cooling chamber according to the third embodiment. In this embodiment, a lamp heater is used in place of the temperature correction unit 45. The lamp heater used instead of the temperature correction unit 45 is an auxiliary heater 57. The auxiliary heater 57 is fixed to a heating/cooling room 21, and turned on when heating a substrate W. Consequently, the auxiliary heater 57 heats the reverse surface of the periphery of the substrate W under heating, thereby reducing a temperature difference between the central portion and periphery of the substrate W. Since this embodiment includes no heat storage member, an operation equivalent to pre-heating is unnecessary.

Fourth Embodiment

In the heating/cooling chamber 17 according to each embodiment described above, the position of the cooling unit is fixed. However, the cooing unit may also be movable. When cooling a substrate W in a heating/cooling chamber of this embodiment, the substrate W is supported by a first support unit 42 or a temperature correction unit having projections for supporting the substrate W, and the cooling unit (a substrate holder 25) rises to a position where the cooling unit is in contact with the reverse surface of the substrate W. No lift pins are necessary because the cooling unit can rise. When heating the substrate W, the cooling unit (substrate holder 25) moves away from the substrate W and moves down.

The present invention is not limited to the above-described embodiments, and various changes and modifications can be made within the spirit and scope of the present invention. Therefore, to apprise the public of the scope of the present invention, the following claims are made.

REFERENCE SIGNS LIST

10 . . . deposition apparatus
11 . . . transfer chamber
12 . . . deposition chamber
13 . . . robot transfer device
13a . . . hand
14 . . . load/unload chamber
15 . . . cleaning chamber
17 . . . heating/cooling chamber
21 . . . heating/cooling room
22 . . . pump room
22a . . . vacuum pump
24 . . . heating unit
25 . . . cooling unit
31 . . . transparent window
33 . . . heating lamp
35 . . . substrate placement unit
37 . . . cooling device
41 . . . substrate support unit
42 . . . first support unit
43a . . . lift pin (second support unit)
45, 46, 47 . . . temperature correction unit
46a . . . heat blocking plate
46b . . . spacer
47a, 57 . . . auxiliary heater
49 . . . correction unit moving device
65a, 65b . . . segment
66 . . . notch

The invention claimed is:

1. A vacuum processing device comprising:
a vacuum chamber;
a substrate support configured to support a substrate in said vacuum chamber;
a heater arranged to face a processing surface of the substrate supported by said substrate support;
a cooler arranged to face a reverse surface of the substrate supported by said substrate support;
a temperature correction unit configured to correct a temperature of a periphery of the substrate in order to reduce a temperature difference between a central portion and the periphery of the substrate by being arranged in a predetermined position between the substrate supported by said substrate support and said cooler when said heater heats the substrate; and
a correction unit moving unit configured to move said temperature correction unit between the predetermined position and a retraction position retracted from the predetermined position,
wherein said substrate support can is configured to move the substrate to a heating position where said heater heats the substrate, and a cooling position where said cooler cools the substrate,
wherein said substrate support includes:
a first support configured to support the substrate in the heating, position; and
a second support configured to receive the substrate supported by said first support in the heating position, and move the substrate to the cooling position,
wherein said correction unit moving unit is configured to have retracted said temperature correction unit to the retraction position in a timing where said second support receives the substrate from the first support in the heating position.

2. The vacuum processing device according to claim 1, wherein
said vacuum chamber is airtightly connected to a transfer chamber including a transfer device configured to transfer the substrate into said vacuum chamber, and
said first support exchanges the substrate with said transfer device.

3. The vacuum processing device according to claim 1, wherein said temperature correction unit is formed into a ring-like shape, having a diameter larger than that of the substrate.

4. The vacuum processing device according to claim 1, wherein
said temperature correction unit includes a plurality of segments, and
said correction unit moving unit is configured to the plurality of segments in different directions.

5. The vacuum processing device according to claim 4, wherein said temperature correction unit has a notch such that said temperature correction unit does not come in contact with said substrate support.

6. The vacuum processing device according to claim 1, wherein when cooling the substrate, said cooler moves to a position where said cooler is in contact with the reverse surface of the substrate supported by said substrate support, and, when heating the substrate, said cooler moves away from the substrate and moves down.

7. The vacuum processing device according to claim 1, wherein said temperature correction unit comprises a beat storage member configured to store heat radiated from said heater.

8. The vacuum processing device according to claim 1, wherein said temperature correction unit comprises:
a heat storage member configured to store heat radiated from said heater; and a heat blocking plate formed between said heat storage member and said cooler, and configured to block heat radiated from said heater.

9. The vacuum processing device according to claim 1, wherein said temperature correction unit comprises a heater configured to heat the periphery of the substrate.

10. A vacuum processing device comprising:

a vacuum chamber:

a substrate support configured to support a substrate in said vacuum chamber;

a heater arranged to face a processing surface of the substrate supported by said substrate support;

a cooler arranged to face a reverse surface of the substrate supported by said substrate support;

a temperature correction unit configured to correct a temperature of a periphery of the substrate in order to reduce a temperature difference between a central portion and the periphery of the substrate by being arranged in a predetermined position between the substrate supported by said substrate support and said cooler when said heater heats the substrate; and a correction unit moving unit configured to move said temperature correction unit between the predetermined position and a retraction position retracted from the predetermined position, wherein said substrate support is configured to move the substrate to a heating position where said heater heats the substrate, and a cooling position where said cooler cools the substrate, wherein said substrate support includes;

a first support configured to support the substrate in the heating position; and a second support configured to receive the substrate supported by said first support in the heating position, and move the substrate to the cooling position, wherein the retraction position is located in a horizontal direction to the predetermined position.

* * * * *